United States Patent [19]
Yamagata

[11] Patent Number: 5,367,493
[45] Date of Patent: Nov. 22, 1994

[54] DYNAMIC TYPE SEMICONDUCTOR MEMORY DEVICE HAVING REDUCED PEAK CURRENT DURING REFRESH MODE AND METHOD OF OPERATING THE SAME

[75] Inventor: Tadato Yamagata, Hyogo, Japan

[73] Assignee: Mitsubishi Denki Kabushiki Kaisha, Tokyo, Japan

[21] Appl. No.: 892,897

[22] Filed: Jun. 3, 1992

[30] Foreign Application Priority Data
Jun. 6, 1991 [JP] Japan .................. 3-134705

[51] Int. Cl.$^5$ .............................................. G11C 7/00
[52] U.S. Cl. .................................. 365/222; 365/205; 365/206; 365/208
[58] Field of Search ............... 365/222, 203, 204, 205, 365/206, 207, 208, 229, 189.01

[56] References Cited

U.S. PATENT DOCUMENTS

| | | | |
|---|---|---|---|
| 4,207,618 | 6/1980 | White, Jr. et al. | |
| 4,627,033 | 2/1986 | Hyslop et al. | 365/205 |
| 4,943,960 | 7/1990 | Komatsu et al. | 365/222 |
| 5,127,739 | 7/1992 | Duvvury et al. | 365/205 |

FOREIGN PATENT DOCUMENTS

| | | | |
|---|---|---|---|
| 55-73988 | 6/1980 | Japan . | |
| 48604 | 4/1986 | Japan | 365/205 |

Primary Examiner—Eugene R. LaRoche
Assistant Examiner—Vu Le
Attorney, Agent, or Firm—Lowe, Price, LeBlanc & Becker

[57] ABSTRACT

A dynamic type semiconductor memory device includes a pair of transistors provided in a signal line for transmitting a sense amplifier drive signal to sense amplifiers. The transistors of the pair are provided in parallel with each other, and are activated to couple the sense amplifiers to a source of generating the sense amplifier drive signal. One of the pair of transistors is made nonconductive in a refresh mode of operation. This arrangement reduces the peak value of a current for charging and/or discharging bit lines by the sense amplifiers in the refresh mode of operation, and reduces a noise on a power source line or a ground line at an on-board level, resulting in stable operation of a system.

13 Claims, 11 Drawing Sheets

DYNAMIC TYPE SEMICONDUCTOR MEMORY DEVICE HAVING REDUCED PEAK CURRENT DURING REFRESH MODE AND METHOD OF OPERATING THE SAME

BACKGROUND OF THE INVENTION

1. Field of the Invention

The present invention relates to a dynamic type semiconductor memory device and a method of operating the same, and more particularly, to a structure for reducing current consumption.

2. Description of the Background Art

A dynamic type semiconductor memory device carrying out dynamic operation is known as one type of a semiconductor memory device. A typical dynamic type semiconductor memory device is a dynamic random access memory (referred to simply as DRAM hereinafter). A memory cell of a DRAM has a structure in which information is stored as charges in a capacitor. If the memory cell is left alone at the condition where the information is written therein, the storage data will gradually disappear because of charge leakage. Periodical refresh operation is required to read out and rewrite (restore) information in the memory cell for reliably retaining the storage data.

FIG. 1 is a block diagram of an entire structure of a typical DRAM. Referring to FIG. 1, a DRAM 100 includes a memory cell array 1 having a plurality of dynamic type memory cells arranged in a matrix, an address buffer 2 for generating internal row and column address signals from an applied address signal, a row decoder 4 for decoding an internal row address signal from address buffer 2 to bring a row (word line) in memory cell array 1 specified by a row address signal to a selected state, and a column decoder 6 for decoding an internal column address signal from address buffer 2 to generate a column selecting signal selecting a corresponding column in memory cell array 1. The DRAM of FIG. 1 has a 4M ×1 organization where 4 bits of memory cells are simultaneously selected in memory cell array 1 according to 10 bits of internal address signals A0–A9. The most significant bit A10 of a row address signal and a column address signal are used to select 1 bit of a memory cell from the 4 bits of memory cells selected simultaneously.

DRAM 100 further includes a sense amplifier block 8 of sense amplifiers for sensing, amplifying and latching the data in memory cells connected to the selected row of memory cell array 1, an I/O gate block 12 responsive to a column selecting signal from column decoder 6 for connecting corresponding columns (4 columns) in memory cell array 1 simultaneously to an internal data bus 10, an input buffer 14 for generating and providing to internal data bus 10 an internal write data from external write data Din at the time of data writing, an output buffer 16 for generating an external read out data from the internal read out data appearing on internal data bus 10 at the time of data reading, and an input/output controller 18 for determining the timing of data writing/reading and which memory cell to select out of the 4 bits of memory cells according to most significant address bit A10.

Input buffer 14 responds to a timing signal $\phi$WR (including bit specify information) from input/output controller 18 to generate an internal write data from external write data Din. Output buffer 16 responds to a timing signal $\phi$RD from input/output controller 18 to generate an external read out data from the read out data on a selected internal data bus line. The internal write data from input buffer 14 is transmitted to an internal data bus line specified by bit A10.

Sense amplifier block 8 includes a sense amplifier provided in each column of memory cell array 1. I/O gate block 12 includes a column select gate (I/O gate) provided in each column of memory cell array 1. The structures of the sense amplifier and the I/O gate will be described afterwards.

DRAM 100 further includes a clock generator 20 responsive to externally applied control signals /RAS, CAS and /WE for generating various internal control signals, a refresh controller 22 for generating a signal controlling refresh operation according to a refresh mode detection signal from clock generator 20, a refresh counter 24 for generating a refresh address signal specifying a row to be refreshed in memory cell array 1, and a multiplexer 26 responsive to a normal mode instructing signal $\phi$A from clock generator 20 and a refresh mode instructing signal $\phi$B from refresh controller 22 for passing and transmitting to a row address buffer (not shown) in address buffer 2 either an external address signal or a refresh address signal.

Signal /RAS is a row address strobe signal for determining a memory cycle of the DRAM and the timing of the operation associated with row selection in memory cell array 1. Signal /CAS determines the timing of data input/output of the DRAM and the timing of the operation associated with column selection in memory cell array 1. Signal /WE indicates the mode of the DRAM (data reading mode or data writing mode), and determines the timing of data writing.

Multiplexer 26 transmits 10 bits A0–A9 of address signal to a row address in address buffer 2, when signal $\phi$A is active indicating normal mode operation. When signal $\phi$B is active indicating refresh mode operation, multiplexer 26 transmits to a row address latch 10 bits of refresh address signal from refresh address counter 24. The most significant address bit A10 is directly supplied to address buffer 2 without passing multiplexer 26.

Address buffer 2 includes a row address latch and a column address latch for latching a row address signal and a column address signal, respectively. The latch timing of each latch is determined by internal RAS signal $\phi$R and internal CAS signal $\phi$C from clock generator 20. Internal RAS signal $\phi$R also determines the decode timing of a row address signal of row decoder 4. Internal signal CAS signal $\phi$C also determines the decoder timing of a column address signal of column decoder 6.

DRAM 100 is applied with power supply voltage Vcc and ground potential Vss. The operation thereof will be briefly described hereinafter.

At the time of normal mode operation, signal /RAS is brought to a low logic level (L) from a high logic level (H), followed by signal /CAS falling to "L" from "H". During normal mode operation, signals CBR and $\phi$B relating to refresh operation are at an inactive state of "L". A row address signal and a column address signal are supplied to DRAM 100 in a time-divisional multiplexed manner.

In response to the fall of signal /RAS, a multiplex control signal $\phi$A is generated from clock generator 20, followed by the generation of internal RAS signal $\phi$R. Both signals attain the active state of "H". Multiplexer 26 responds to signal $\phi$A to provide external address signal A0–A9 to address buffer 2. Address buffer 2 latches address signal bits A0–A9 from multiplexer 26 and the remaining most significant address bit A10 in response to internal RAS signal φR to generate an internal row address signal.

Row decoder 4 responds to internal RAS signal φR to decode an internal row address signal (A0–A9) from address buffer 2 to bring a corresponding row in memory cell array 1 to a selected state. The data in one row of memory cells are read out in memory cell array 1 to be amplified and latched by sense amplifier block 8.

Then, signal /CAS attains a "L" level, and internal CAS signal φC attains a "H" level. The column address latch in address buffer 2 is activated, whereby an applied address signal (not passing multiplexer 26) is latched to generate internal column address signal of 11 bits A0–A10. Column decoder 6 responds to internal CAS signal φC for decoding 10 bits A0–A9 of address signal from address buffer 2 to generate a column selecting signal.

I/O gate block 12 responds to a column selecting signal for connecting corresponding 4 columns in memory cell array 1 to internal data bus 10.

At the data read out mode of operation, read out signal φRE is generated in response to the fall of signal /CAS to "L" (signal /WE is "H"). Input/output controller 18 responds to 2 bits of address signal A0 (row and column) and to read out signal φRE to generate a read out instructing signal φRD. Output buffer 16 responds to signal φRD to generate an external read out data from the internal read out data on a corresponding data bus line.

At data writing mode of operation, write signal φW is generated in response to the fall of signals /CAS or /WE whichever is later. Input/output controller 18 responds to 2 bits of address signal A0 and write signal φW to generate a write instructing signal φWR. Input buffer 14 responds to write instructing signal φWR to generate an internal write data from external write data Din. The internal write data is transmitted to the selected memory cell via a corresponding internal data bus line and an I/O gate. Thus, the writing operation of data into a selected memory cell is completed. Signal /WE may be used to control the operations of input buffer 14 and output buffer 16.

A refresh mode is set by pulling down signal /CAS to "L" prior to the fall of signal /RAS. This refresh mode set by the relative timing of these signals is called "/CAS before /RAS refresh mode" (referred to as CbR refresh hereinafter). In response to the fall of signal /CAS when signal /RAS is at a H level, refresh mode detection signal CBR is generated from clock generator 20. Signal CBR attains an active state of "H". Refresh controller 22 is activated in response to signal CBR, whereby multiplex control signal φB attains an active state of H. Refresh address counter 24 has its count incremented (or decremented) by 1 at the time of completion of the preceding refresh cycle, and enters a count value latching state.

Multiplexer 26 responds to signal φB to pass and provide, to a row address latch in address buffer 2, 10 bits Q0–Q9 of address signal from refresh address counter 24. Address buffer 2 responds to internal RAS signal φR generated in response to the fall of signal /RAS to latch the supplied refresh address signal of 10 bits Q0–Q9. Row decoder 4 responds to signal φR for decoding an address signal from address buffer 2 to bring one row in address cell array 1 to a selected state.

Then, each sense amplifier in sense amplifier block 8 is activated, whereby the data in the memory cells connected to the selected row are sensed and amplified. The amplified data are rewritten into corresponding memory cells.

The normal data writing and reading operation is not carried out during the refresh cycle. Therefore, the operation of column selection by signal /CAS is not performed. When signal /RAS attains a H level, the refresh mode of operation is completed to terminate one refresh cycle. At the time of completion of refresh operation, a count pulse signal is generated from refresh controller 22 to increment (or decrement) the count by 1 in refresh address counter 24. This refresh cycle is executed at regular intervals (periodically).

FIG. 2 shows a functional structure of the clock generator of FIG. 1. Referring to FIG. 2, clock generator 20 includes a RAS buffer 201 receiving an externally applied row address strobe signal /RAS for generating internal RAS signal φR and multiplex control signal φA through a gate circuit 214 responsive to a CBR refresh detection signal CBR, a sense amplifier activation circuit 202 responsive to internal RAS signal φR from RAS buffer 201 for generating sense amplifier activation signals SA and /SA, and a CBR detection circuit 204 responsive to external row address strobe signal /RAS and external column address strobe signal /CAS for generating a refresh mode detection signal CBR.

CBR detection circuit 204 may be implemented with a flipflop where signal /CAS is latched at the falling edge of signal /RAS and reset at the rising edge of signal /RAS. RAS buffer 201 includes an inverter circuit 211 for buffer-processing the signal /RAS to generate the signal φA, and cascade-connected inverter circuits 212 and 213 to delay the signal φA from inverter circuit 211 for generating internal RAS signal φR.

Sense amplifier activation circuit 202 delays internal RAS signal φR for a predetermined time period to generate sense amplifier activation signals SA and /SA. As described later, the sense amplifier of the DRAM includes cross-coupled n channel MOS (insulated gate type) transistors for an n type sense amplifier, and cross-coupled p channel MOS transistors for a p type sense amplifier. Sense amplifier activation signal SA activates the n type sense amplifier, and signal /SA activates the p type sense amplifier.

Clock generator 20 further includes a CAS buffer 206 responsive to external control signal /CAS and internal RAS signal φR for generating internal CAS signal φC, a read clock generator 210 responsive to internal CAS signal φC for generating read out signal φRE, and a write clock generator 208 responsive to internal CAS signal φC and external control signal /WE for generating write signal φW. Write signal φW is generated when internal CAS signal φC and external signal /WE both attain an active state. Read out signal φR is generated when internal CAS signal φC attains an active state.

CAS buffer 206 includes a gate circuit 221 for receiving internal RAS signal φR and external control signal /CAS and a CAS before RAS detection signal CBR, and a CAS clock generator 222 responsive to the output of gate circuit 221 for generating internal CAS signal φC. Gate circuit 221 generates a signal of an active state of "H" when internal RAS signal φR attains an active state of "H" and external control signal /CAS and the signal CBR attain an active state of "L". CAS clock generator 222 brings internal CAS signal φC to an active state of H when the output signal of gate circuit 221 attains an active state of "H". Internal CAS signal $\phi C$ is generated only when signal /RAS attains an L level.

FIG. 3 is a signal waveform chart indicating the operation of the clock generator of FIG. 2. The operation of the clock generator will be described briefly hereinafter in reference to FIGS. 2 and 3.

At the time of normal mode operation, signals /RAS and /CAS are pulled down sequentially. In response to the fall of signal /RAS, first signal $\phi A$ and then signal $\phi R$ are generated from RAS buffer 201, both attaining an active state. In response to the fall of signal /CAS, internal CAS signal $\phi C$ is generated from CAS buffer 206 to attain an active state. At the time of data writing, signal /WE falls, whereby write signal $\phi W$ is generated from write clock generator 208. When signal $\phi C$ rises prior to the fall of signal /WE, write signal $\phi W$ is generated in response to the fall of signal /WE. When the rise of signal $\phi C$ is later than the fall of signal /WE, write signal $\phi W$ is generated in response to signal $\phi C$. Read out signal $\phi RE$ is generated from read clock generator 210 in response to the rise of signal $\phi C$.

It is assumed that a DRAM has the data output terminal and the data input terminal provided separately. An arrangement may be used so that signal /WE is applied to input buffer 14 and output buffer 16 shown in FIG. 1 and only output buffer 16 is activated when signal /WE is "H", and only input buffer 14 is activated when signal /WE is "L".

At the time of CbR refresh mode, signal /CAS is pulled down earlier than signal /RAS. In response to the fall of signal /CAS, refresh mode detection signal CBR is generated from CBR detection circuit 204. In response to signal CBR, signal $\phi B$ is generated from refresh controller 22 shown in FIG. 1 to select a refresh address. During the refresh operation, signal /WE is generally maintained at the H level, and the toggle of signal /CAS is inhibited. In response to the fall of signal /RAS, internal RAS signal $\phi R$ is generated from RAS buffer 201 to initiate a refresh operation according to a refresh address. The rise of signal /RAS terminates the refresh operation cycle, whereby the DRAM enters a standby state. Signal /CAS may rise according to signal /RAS. Signal /CAS may rise after a predetermined time period after the fall of signal /RAS (CAS after RAS hold time).

FIG. 4 shows the structure of the components corresponding to 1 column of memory cell array 1 of FIG. 1. Referring to FIG. 4, one column in memory cell array 1 corresponds to a pair of bit lines BL and /BL, and one row corresponds to one word line WL. FIG. 4 typically shows two word lines WL1 and WL2 corresponding to two rows.

A memory cell MC1 is provided corresponding to the crossing of bit line BL and word line WL1. A memory cell MC2 is provided corresponding to the crossing of bit line /BL and word line WL2. Memory cell MC1 includes a capacitor C1 for storing information, and a memory transistor T1 formed of an n channel MOS transistor responsive to a signal on word line WL1 for electrically connecting capacitor C1 to bit line BL. Memory cell MC2 includes a capacitor C2 and a memory transistor T2. Respective one electrodes (cell plate) of capacitors C1 and C2 receive Vcc or a predetermined potential Vcp which is $\frac{1}{2}$ the level of Vcc.

Sense amplifier block 8 includes sense amplifier 30 provided corresponding to each pair of bit lines. Sense amplifier 30 includes a pair of cross-coupled p channel MOS transistors P1 and P2, and a pair of cross-coupled n channel MOS transistors N1 and N2. The sense amplifier portion of p channel MOS transistors P1 and P2 (referred to as "P sense amplifier" hereinafter) is activated in response to the signal on signal line 32 to charge the higher potential bit line BL or /BL to the level of power supply voltage Vcc. The sense amplifier portion of n channel MOS transistors N1 and N2 (referred to as "N sense amplifier" hereinafter) is activated in response to a signal on signal line 34 to discharge the lower potential bit line of bit lines BL and /BL to ground potential Vss.

Signal lines 32 and 34 are driven by sense amplifier drive transistors T5 and T6, respectively. Drive transistor T5 is formed of a p channel MOS transistor, responsive to sense amplifier activation signal /SA, for transmitting power supply potential Vcc to signal line 32. Drive transistor T6 is formed of a n channel MOS transistor, responsive to sense amplifier activation signal SA to transmit ground potential Vss to signal line 32. Sense amplifier activation signals SA and /SA are generated from sense amplifier activation circuit 202 of FIG. 2.

I/O gate block 12 of FIG. 1 includes a column select gate provided in each pair of bit line. A gate transistor T3 is provided in bit line BL, and a gate transistor T4 is provided in bit line /BL. Gate transistors T3 and T4 conduct in response to a column selecting signal Y from column decoder 6 of FIG. 1 to connect bit lines BL and /BL to data bus lines (I/O line) DB and /DB, respectively. The operation of the circuit components of FIG. 4 will be described hereinafter.

The operation at the time of data reading will first be described with reference to the operation waveform diagram of FIG. 5. The memory cycle is initiated when signal /RAS is pulled down. First, a row selection operation is carried out according to a row address signal. A word line drive signal WL is transmitted to a word line selected by row decoder 4 (refer to FIG. 1), whereby the potential of the selected word line rises. It is assumed that word line WL1 is selected. Bit lines BL and /BL are maintained at an intermediate potential of $\frac{1}{2}$ Vcc level by precharge/equalize means (not shown) when at a standby state, and attains a floating state upon the initiation of a memory cycle.

Upon selection of word line WL1, transistor T1 of memory cell MC1 conducts, whereby memory capacitor C1 is connected to bit line BL. This causes the conduction of charges between memory capacitor C1 and bit line BL, so that the potential of bit line BL changes from the intermediate potential to a potential corresponding to the information stored in memory capacitor C1. Referring to FIG. 5, the potential change of the bit line is shown where data "1" (H) is stored in memory capacitor C1. Because memory cell data is not transmitted to the other bit line /BL, bit line /BL maintains the intermediate potential (precharge potential).

Sense amplifier activation signals SA and /SA are generated sequentially when the difference in potential between bit line BL and bit line /BL becomes sufficiently great. More specifically, N sense amplifier activation signal SA rises from "L" to "H", and P sense amplifier activation signal /SA falls from "H" to "L".

Transistor T6 conducts in response to N sense amplifier activation signal SA, whereby signal line 34 attains ground potential level. The N sense amplifier (transistors N1 and N2) is activated, whereby bit line /BL is discharged through transistor N2 and drive transistor T6. The potential of bit line /BL falls from the intermediate potential to ground potential.

Drive transistor T5 conducts in response to P sense amplifier activation signal /SA, whereby signal line 32 is charged to the level of power supply potential Vcc. The P sense amplifier (transistors P1 and P2) is activated so that bit line BL is charged to the level of power supply voltage through transistor P1 and drive transistor T5.

In other words, sense amplifier 30 amplifies differentially the potentials of bit lines BL and /BL. The potentials of bit lines BL and /BL attaining "H" and "L", respectively, are maintained by sense amplifier 30.

Signal /CAS falls, so that the operation of column selection is carried out according to a column address signal. A column selecting signal Y is generated from the column decoder (refer to FIG. 1).

At the time of data reading, signal /WE maintains the H level. In response to column selecting signal Y, I/O gates (column select gate) T3 and T4 conduct, whereby the potentials of "H" and "L" on bit lines BL and /BL, respectively are transmitted to data bus lines DB and /DB, respectively. An output buffer (refer to FIG. 1) generates and outputs an external read out data according to the signal potentials on data bus lines DB and /DB.

Signals /RAS and /CAS rise to "H" to complete one memory cycle. Then, the DRAM returns to a standby state.

Then, the operation of data writing will be described hereinafter with reference to FIG. 6. The operation of data writing is similar to that of data reading shown in FIG. 5 up to the end of the sense operation of sense amplifier 30. The fall of signal /WE to "L" causes an internal write data to be generated by the input buffer (refer to FIG. 1) and transmitted on data bus lines DB and /DB.

Upon the rise of column selecting signal Y, bit lines B1 and /BL are connected to data bus lines DB and /DB, respectively. The driving capability of the input buffer is greater than the latching ability of sense amplifier 30, so that the potentials on bit lines BL and /BL attain a level corresponding to the internal write data. In FIG. 6, the transfer of write data to bit lines BL and /BL are shown in broken lines.

The internal write data transmitted to bit lines BL and /BL is amplified and latched by sense amplifier 30. When the accumulated charges in capacitor C1 of memory cell MC1 reach an amount corresponding to the write data, signals /RAS and /CAS rise to "H" and word line drive signal WL falls to "L". The DRAM then enters a standby state.

The refresh operation will be described hereinafter with reference to the operational waveform diagram of FIG. 7. At the time of a refresh mode of operation, signal /CAS and then signal /RAS fall to the "L" level.

In response to the fall of signal /RAS, an operation of row selection is executed according to a refresh row address signal from the refresh address counter. A refresh-row is selected, whereby the potential of the selected word line rises to "H". This causes the data in the memory cells of one row to be transmitted to corresponding bit lines. When the refresh row address signal specifies word line WL1, the stored information in capacitor C1 of memory cell MC1 is transmitted to bit line BL.

Then, sense amplifier 30 is activated by sense amplifier activation signals SA and /SA, whereby the potentials of bit lines BL and /BL change to "H" of Vcc level and "L" of Vss level according to the read out information. FIG. 7 shows the potential change of a bit line, where memory cell capacitor MC1 stores data "H". The potential (read out data) of the bit line that is sensed, amplified, and latched by sense amplifier 30 is written again into capacitor C1 of memory cell MC1. Thus, the stored information in memory cell MC1 is refreshed.

At the time of refresh mode, the toggle of signal /CAS is not carried out, and internal CAS signal $\phi C$ is not generated. In other words, column selecting signal Y is not generated. Signal /WE is maintained at the H level. Thus, only a refresh operation of the storage data in the memory cells of 1 row is carried out. When signal /RAS rises to "H", and word line drive signal WL falls to "L", one refresh cycle is completed. Signal /CAS may be pulled up to "H" at the time of completion of the refresh cycle. Alternatively, signal /CAS may rise in a predetermined time period after the fall of signal /RAS.

A DRAM carrying out an automatic refresh operation wherein a refresh address is generated internally from an address counter is disclosed in U.S. Pat. No. 4,207,618, for example. In this prior art, a refresh mode is set by an external signal /REF (signal /RAS is "H").

As described in the foregoing where dynamic operation is performed in a DRAM, current flows through the power source line and the ground line for every cycle since a signal line is precharged for each cycle and charge/discharge of a bit line is carried out when sense amplifier is operated.

FIG. 8 shows a waveform diagram of power supply current at the time of normal mode cycle and CbR refresh cycle. In FIG. 8, peak A indicates the current associated with a bit line charging when a sense amplifier is operated, peak B indicates the current associated with the operation of the circuitry for data reading/writing, and peak C indicates the precharge current consumed at the time of transition into a standby state for precharging each signal line such as a bit line.

In a refresh mode, the current indicated by peak B is not generated since data input or output is not carried out.

In a DRAM, charge/discharge of bit line pairs crossing a selected row is carried out simultaneously. Therefore, the greatest current consumption, indicated by peak A, is caused by the charging current associated with the operation of a sense amplifier in the operations of a DRAM.

It is appreciated from the operational waveform diagrams of FIGS. 5–7 that the operation of word line selection (drive) up to differential amplification operation of a bit line potential by activation of a sense amplifier is identical for respective modes of data reading, data writing, and refresh operation. In other words, peak A in a normal mode, and peak A in CbR refresh mode are identical in level as shown in FIG. 8.

A DRAM is seldom used in singularity. In general, a plurality of DRAMs are mounted on a board.

A case is considered where DRAM chips #11–#48 are arranged in 4 rows and 8 columns, as shown in FIG. 9. Each of DRAM chips #11–#48 has a x1 organization, whereby data input and output of 1 word=8 bits can be carried out by 8 DRAM chips in the same row.

DRAM chips #11–#18, DRAM chips #21–#28, DRAM chips #31–#38, and DRAM chips #41–#48 are enabled by a chip enable signal CE1, a chip enable signal CE2, a chip enable signal CE3 and a chip enable signal CE4, respectively. Chip enable signals CE1–CE4 may be a bank selecting signal, or an address region specify signal in a CPU address space.

An operating power supply voltage is applied to DRAM chips #11–#48 from the same power source via a power source line. In such a case where a plurality of DRAM chips are mounted on a board, it is desired to minimize the peak value (maximum level of peak A) of the charging current of a bit line during the operation of a sense amplifier, from the standpoint of the influence of noise to a power source line. This is because a sudden flow of a great amount of current will change the power supply potential to incur noise. A small peak value is also desirable to stabilize power supply voltage, such as in the case of a notebook type personal computer using a battery for the power source which have a relatively small capacity.

A possible method for suppressing the peak value of charging current at the time of a sense amplifier operation is to reduce the size of transistor T5 of FIG. 4 to lower the current driving capability thereof, resulting in a slower charging of a bit line.

Furthermore, from the standpoint of noise caused by discharging current flowing to ground line, it is desirable that the peak value of the discharging current associated with the discharge operation of a bit line (identical to peak A) during sense amplifier operation is small. Therefore, an approach can be considered to reduce the current driving capability of transistor T6 of FIG. 4 by reducing its size.

The above-described method of reducing the size of a drive transistor offers a state equivalent to a relatively great resistance existing in a charging path from power supply voltage Vcc to bit line BL (/BL) and/or in a discharging path to ground potential Vss, whereby the bit line charging/discharging current (during sense amplifier operation) is decreased to lower the peak value of the peak current (peak A).

However, since the charge/discharge operation of the bit line is carried out mitigatedly in the above described method, the time period required for producing a potential difference in the bit line pair that is great enough to allow a stabilized operation of a sense amplifier becomes longer. This will cause delay in the generation timing of column selecting signal Y to increase the access time, resulting in degradation in access speed.

In the case where a plurality of DRAM chips are mounted on a board as shown in FIG. 9, DRAM chips of one row are accessed in the normal mode, whereas all DRAM chips or all non-access DRAM chips are refreshed simultaneously in the refresh mode. In a memory system implemented with a plurality of DRAM chips, the number of DRAM chips operated simultaneously in the normal mode is less than the number of DRAM chips operated simultaneously in the refresh mode. This means that the effect of noise caused by peak current on the power supply line or ground line on a board is greater at the time of a refresh mode cycle than at the time of a normal mode cycle.

If the peak current associated with the bit line charging/discharging operation during sense amplifier operation can be reduced at least at the time of refresh cycle, the effect of noise on the power line and/or ground line on a board can be decreased to prevent erroneous operation of the system.

Japanese Patent Laying-Open No. 55-73988 discloses a technique where DRAM chips on a board are grouped to decrease peak current by varying the refresh timing for each group unit. However, no consideration is taken for reducing the peak value of peak current associated with the charging/discharging operation of a bit line in the level of a single DRAM unit.

SUMMARY OF THE INVENTION

An object of the present invention is to provide a dynamic type memory device in which the effect of noise (by peak current) on a power line and/or a ground line when mounted on a board is small, without penalty in access time.

Another object of the present invention is to provide a method of operating a dynamic type memory device allowing reduction in the effect of noise (by peak current) on a power line and/or a ground line on a board when mounted on a board.

A dynamic type memory device according to the present invention has the amount of current of charging/discharging of a bit line in sense amplifier operation more reduced in the refresh mode than in the normal mode.

Because all the peak values of peak current are reduced in the mount-on-board level, the effect of noise by peak current on a power line and/or a ground line is lowered to prevent erroneous operation in the system caused by noise.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Figure 10:
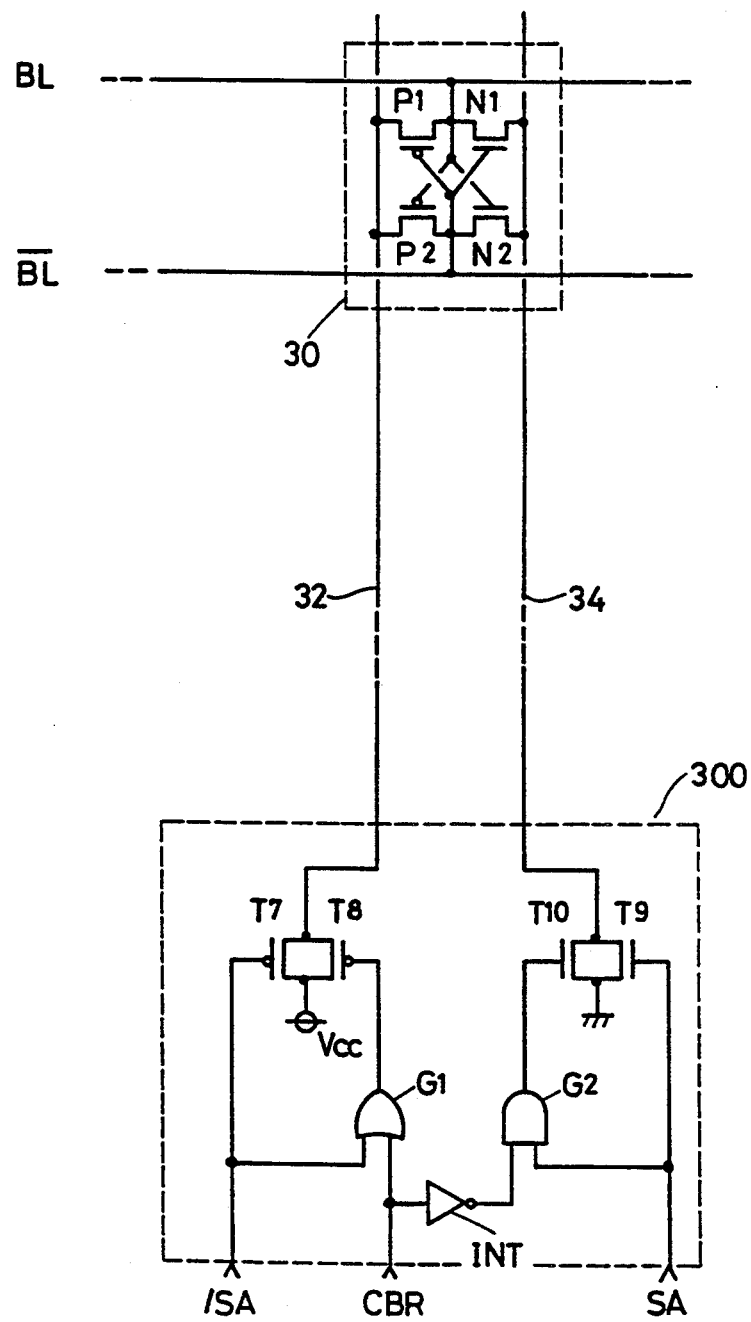
FIG. 10 shows a structure of the main part of a DRAM according to an embodiment of the present invention.

FIG. 10 shows a structure of the main part of a DRAM according to an embodiment of the present invention.

Figure 1:
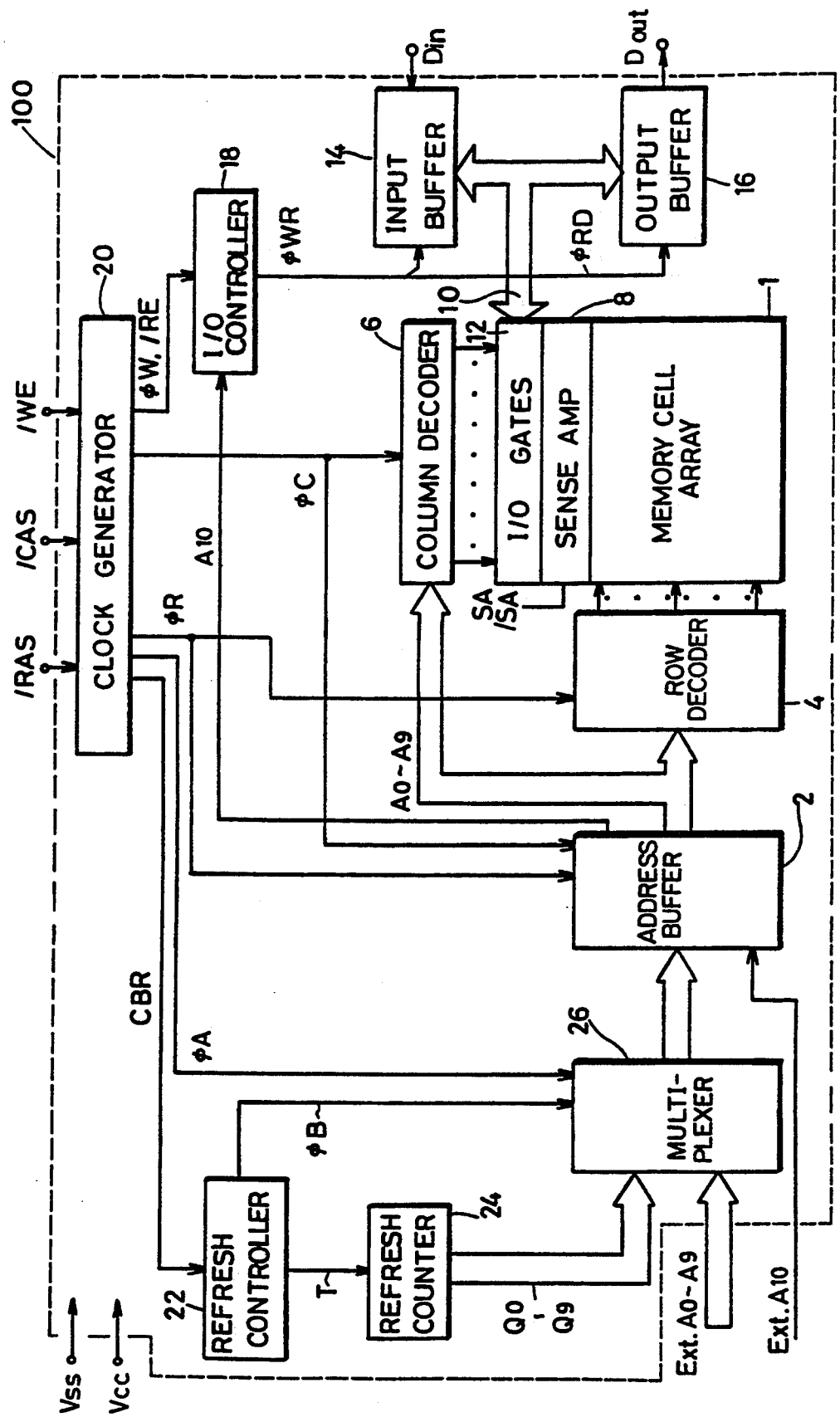
FIG. 1 shows an entire structure of a conventional DRAM.

Referring to FIG. 10, the DRAM includes a current adjusting circuit 300 for altering the amount of charge/discharge current of a bit line between a normal mode and a refresh mode. Current adjusting circuit 300 also serves to drive each sense amplifier in sense amplifier block 8 (refer to FIG. 1). The structure of this DRAM according to an embodiment of the present invention is similar to that of the conventional DRAM of FIG. 1.

Current adjusting circuit 300 includes an OR circuit G1 for receiving a P sense amplifier activation signal /SA and a refresh mode detection circuit CBR, a P channel MOS transistor T7 responsive to P sense amplifier activation signal /SA for charging P sense amplifier drive signal line 32 to the level of power supply voltage Vcc, and a P channel MOS transistor T8 responsive to the output of OR circuit G1 for charging signal line 32 to the level power supply voltage Vcc. Transistors T7 and T8 are provided in parallel to each other. The sizes of these transistors are adjusted so that their combined current driving capability is similar to that of P sense amplifier drive transistor T5 in a conventional DRAM.

Current adjusting circuit 300 further includes an inverter circuit INT for receiving a refresh mode detection signal CBR, an AND circuit G2 for receiving the output of inverter circuit INT and an N sense amplifier activation signal SA, an n channel MOS transistor T9 responsive to N sense amplifier activation signal SA for discharging N sense amplifier drive signal line 34 to ground potential Vss, and an n channel MOS transistor T10 responsive to the output of AND circuit G2 for discharging signal line 34 to ground potential Vss.

Transistors T9 and T10 have their sizes adjusted so that the combined current driving capability thereof is similar to that of N sense amplifier drive transistor T6 of a conventional DRAM.

AND circuit G2 provides a signal of a H level only when both the input signals thereof are "H". OR circuit G1 provides a signal of H level when at least one of the input signals is "H". The operation of sense amplifier 30 and current adjusting circuit 300 of FIG. 10 will be described hereinafter.

Figure 11:
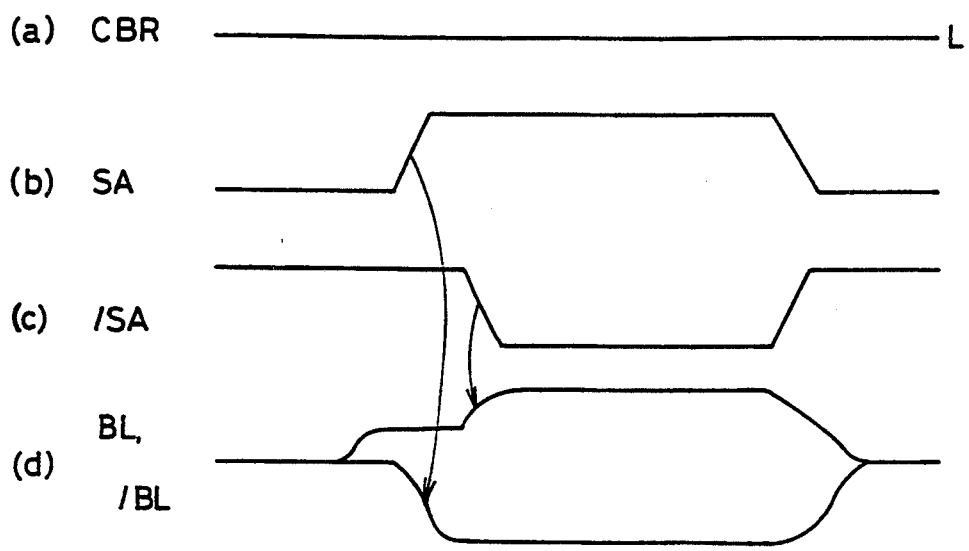
FIG. 11 is a signal waveform diagram showing the operation of each component of FIG. 10 at the time of normal mode operation.

The operation in the normal mode will first be described with reference to the operational waveform of FIG. 11. At the time of normal mode of operation, data input/output is carried out. The operations of row selection and column selection are similar to those of conventional cases.

Sense amplifier 30 is driven after the selection of a word line. Refresh mode detection signal CBR is "L" in the normal mode. In this state, OR circuit G1 and AND circuit G2 both function as buffer circuits.

Figure 2:
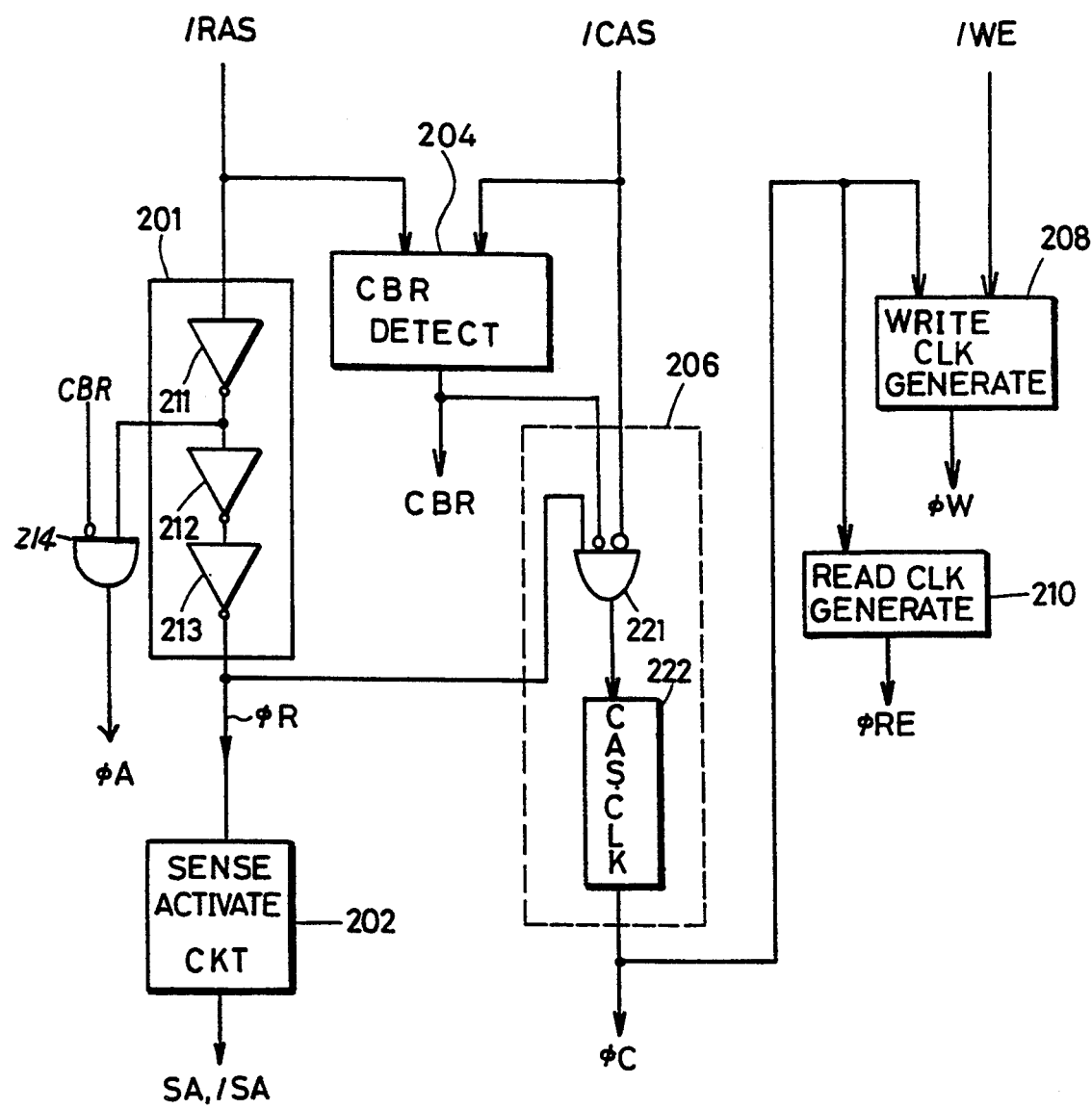
FIG. 2 shows a structure of the clock generator of FIG. 1.
Figure 3:
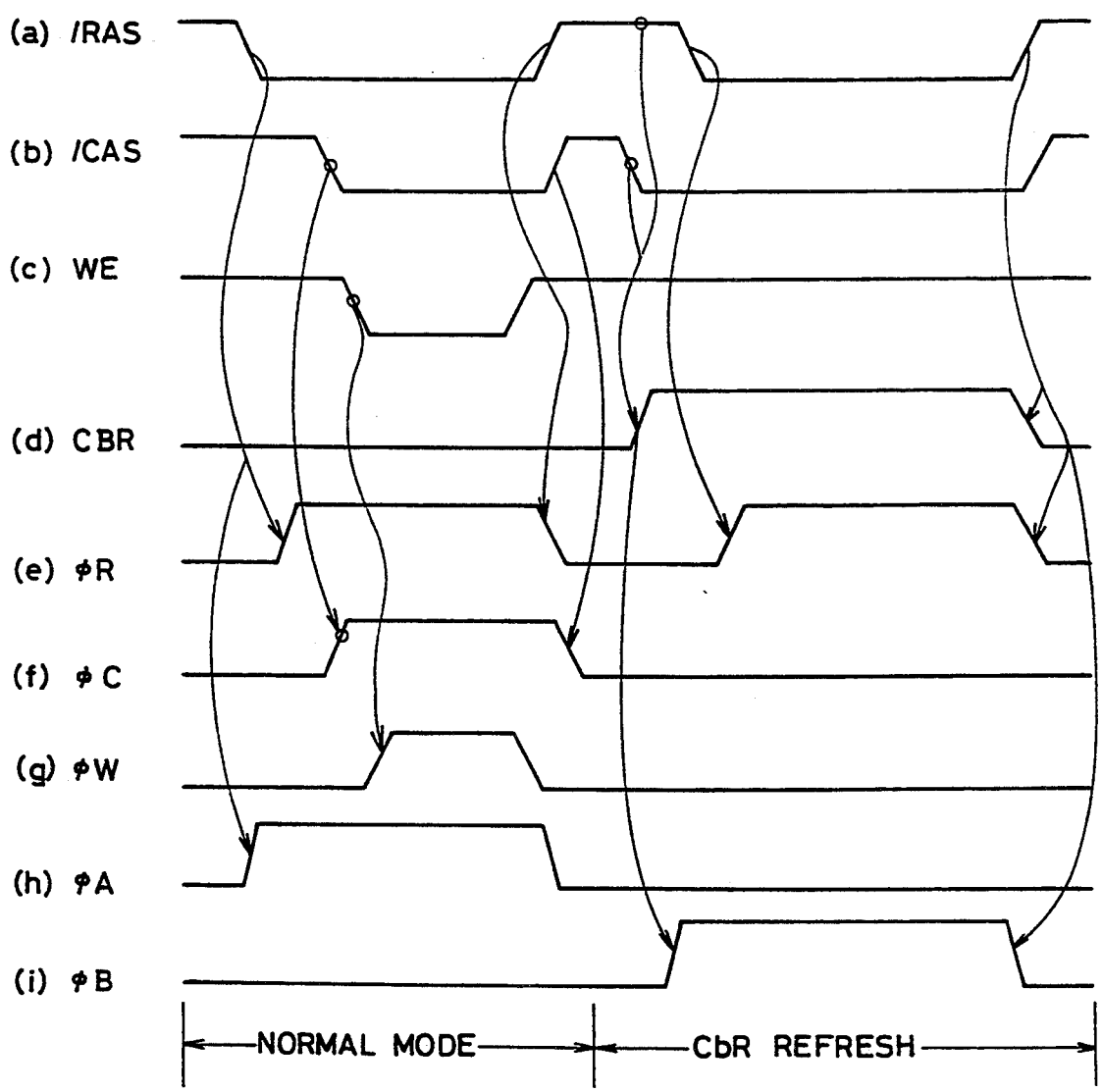
FIG. 3 is a signal waveform diagram showing the operation of each circuit of the clock generator of FIG. 2.
Figure 4:
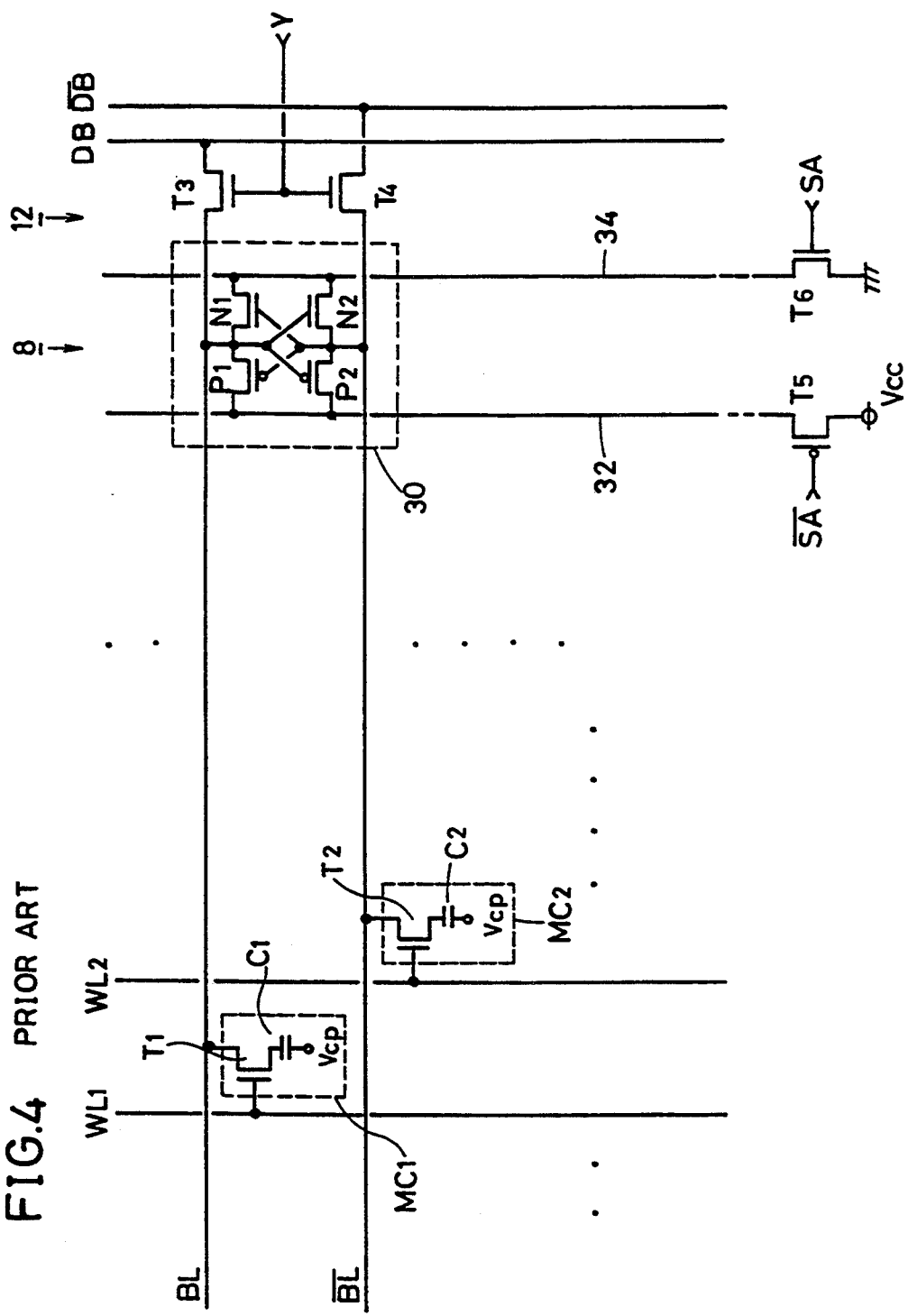
FIG. 4 shows a partial structure of the memory cell array of FIG. 1 relating to one column.
Figure 5:
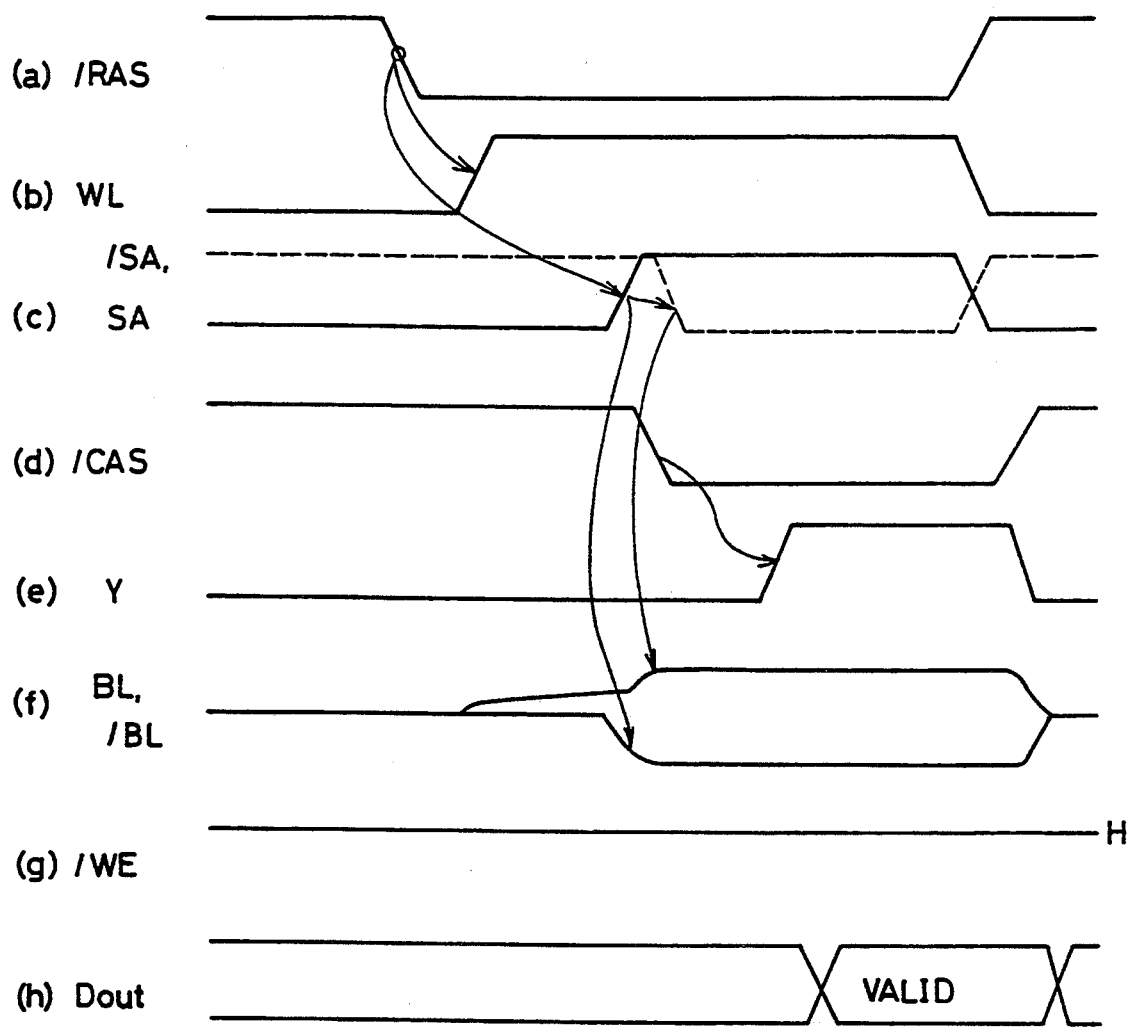
FIG. 5 is a signal waveform diagram showing the operation of each component of FIG. 4 at the time of data reading.
Figure 6:
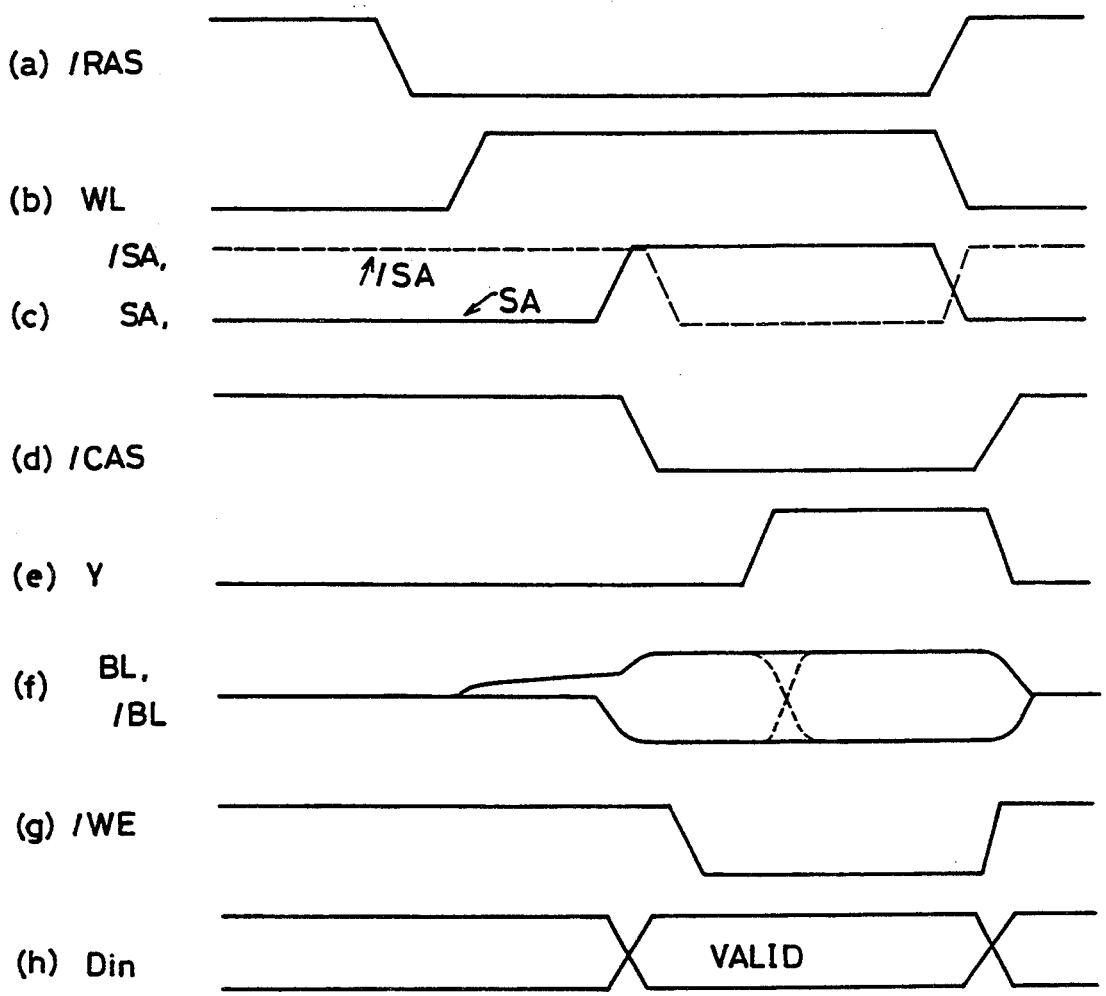
FIG. 6 is a signal waveform diagram showing the operation of each component of FIG. 4 at the time of data writing.
Figure 7:
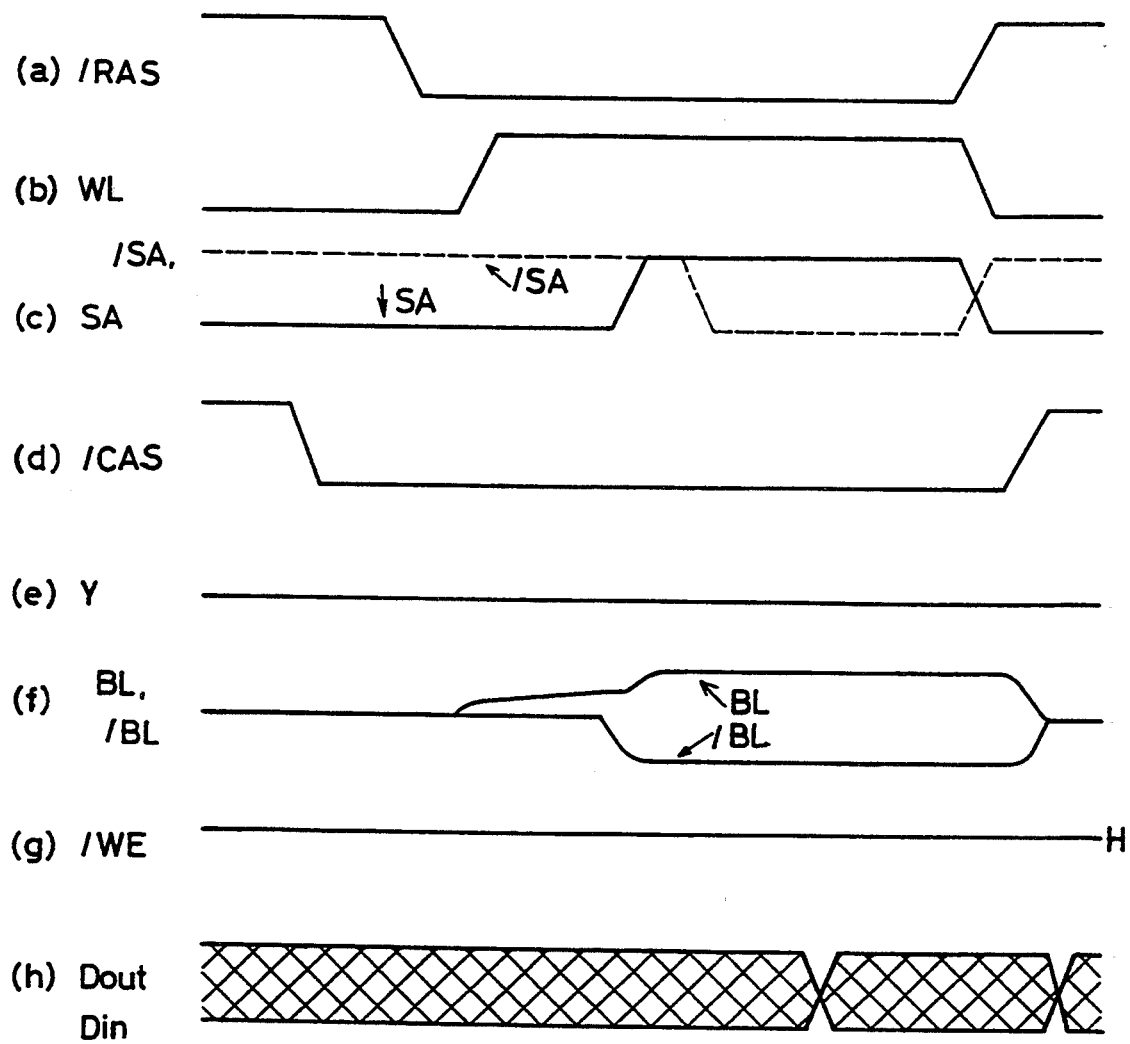
FIG. 7 is a signal waveform diagram showing the operation of each component of FIG. 4 at the time of refresh operation.
Figure 8:
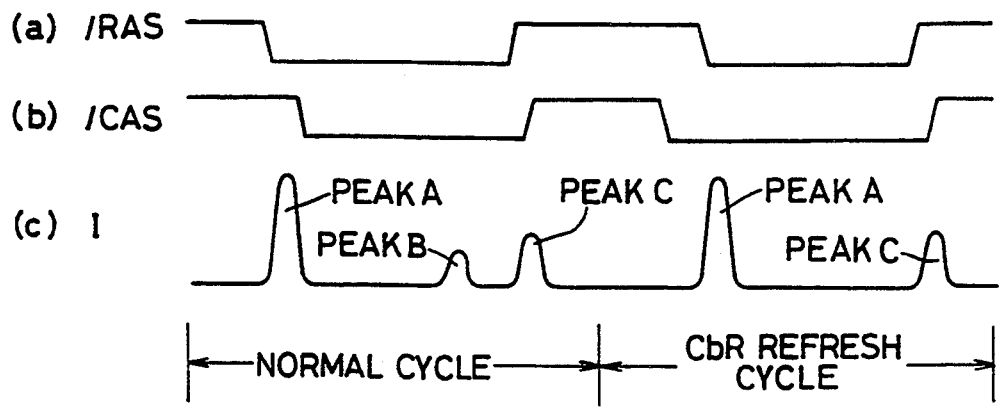
FIG. 8 is a representation of consumed current in a conventional DRAM.
Figure 9:
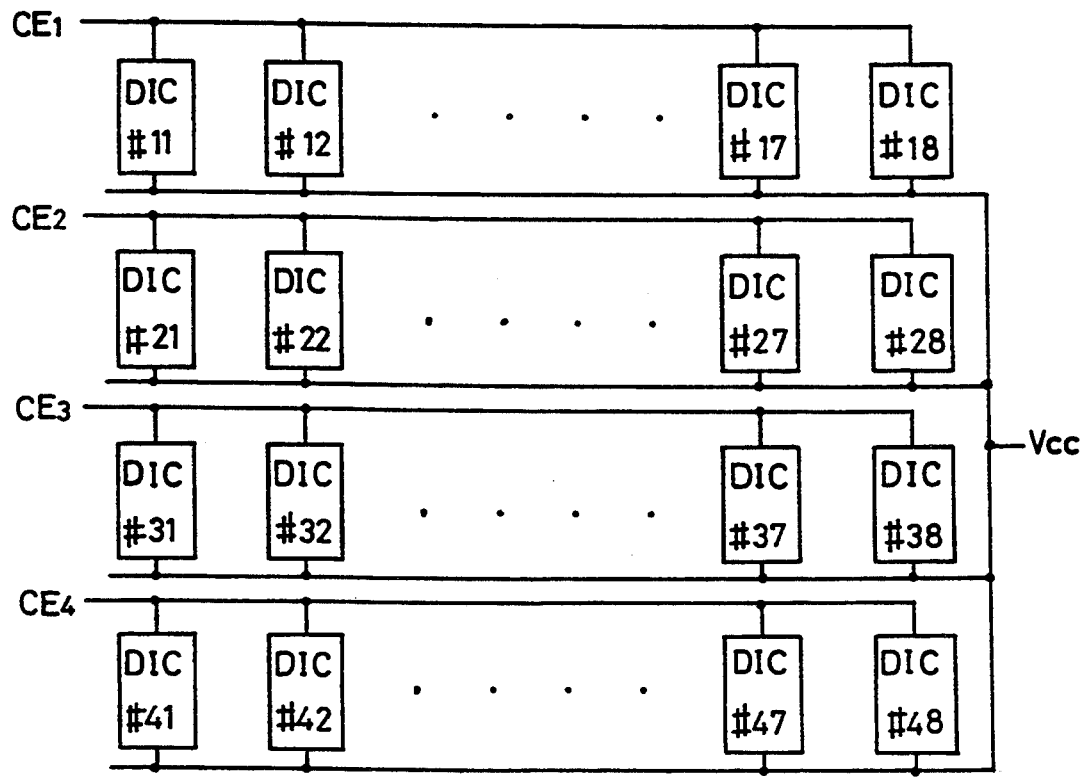
FIG. 9 shows an example of the arrangement of DRAM chips on a board.

When the potential difference between bit lines BL and /BL becomes great enough, sense amplifier activation signals SA and /SA are generated from the sense amplifier activation circuit (refer to FIG. 2) at a timing similar to that of a conventional case. In response to an N sense amplifier activation signal SA of a H level, drive transistors T9 and T10 conduct. Bit line BL (or /BL) is discharged to ground potential via the N sense amplifier (transistor N1 or N2) and drive transistors T9 and T10. The combined current driving capability of transistors T9 and T10 is great enough, whereby discharging of bit line BL (/BL) is carried out at high speed, as in conventional cases.

In response to the fall of P sense amplifier activation signal /SA to "L", drive transistors T7 and T10 both conduct. Transistors T7 and T8 have a sufficient great combined current driving capability. Bit line /BL (or BL) is charged to the level of power supply voltage Vcc via signal line 32 and transistors T7 and T8 at high speed similar to that of a conventional case.

The attaining timing of bit lines BL and /BL to "H" and "L" is similar to that of a conventional DRAM, so that data reading and writing can be carried out at a timing similar to that of a conventional DRAM.

Figure 12:
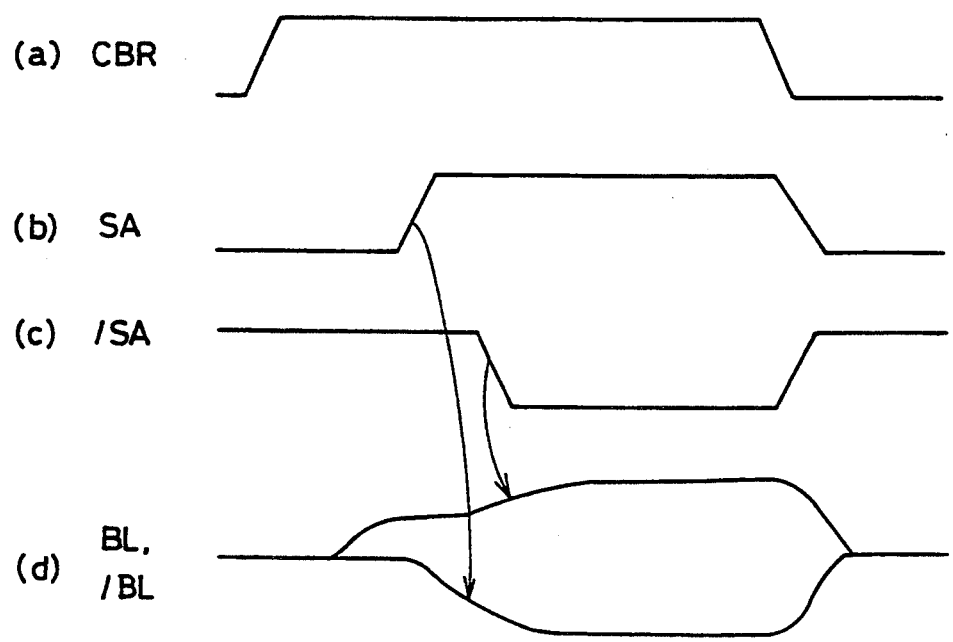
FIG. 12 is a signal waveform diagram showing the operation of each component of FIG. 10 at the time of refresh mode operation.

Next, the operation in the refresh mode will be described with reference to the operational waveform diagram of FIG. 12. In refresh mode, refresh mode detection signal CBR rises to "H". This causes the outputs of OR circuit G1 and AND circuit G2 to attain "H" and "L", respectively. Transistors T8 and T10 are turned off during the cycle of refresh operation.

When the potential difference between bit lines BL and /BL reach sufficiently great levels, sense amplifier activation signals SA and /SA are generated.

When N sense amplifier activation signal SA rises to a H level, drive transistor T9 conducts. Bit line BL (or /BL) is discharged to ground level Vss via N sense amplifier (transistor N1 or N2), signal line 34 and transistor T9. Because this discharge is carried out only via transistor T9, the speed of potential drop of the bit line is slower than that of normal mode. A plurality of sense amplifiers are connected to drive line 34. The discharging capability of all the sense amplifiers are determined by the current driving capability of transistor T9. Accordingly, the driving capability of the N sense amplifier is reduced. The peak value of discharging current flowing to the ground line is reduced, while the distribution width of the peak current is increased!.

Drive transistor T7 conducts in response to P sense amplifier activation signal /SA attaining a L level, whereby signal line 32 is charged to the level of Vcc. Bit line /BL (or BL) is charged to Vcc level via P sense amplifier (transistor P2 or P1), drive line 32 and transistor T7. This charging is carried out simultaneously for all the sense amplifiers connected to signal line 32. Accordingly, the driving capability of P sense amplifier is reduced. Because this charging is carried out only through transistor T7, the speed of potential rise of the bit line is slower than that of normal mode operation.

The charge current supplied from power supply Vcc is determined by transistor T7, whereby the peak value of charge current becomes smaller than that of normal mode operation.

The attaining timing of the potentials of bit lines BL and /BL to "H" and "L" is delayed as compared to that of normal mode operation. This causes no problem because data input/output is not carried out at the time of refresh operation and only data restore is carried out. Only the time required for restoring must be ensured.

Figure 13:
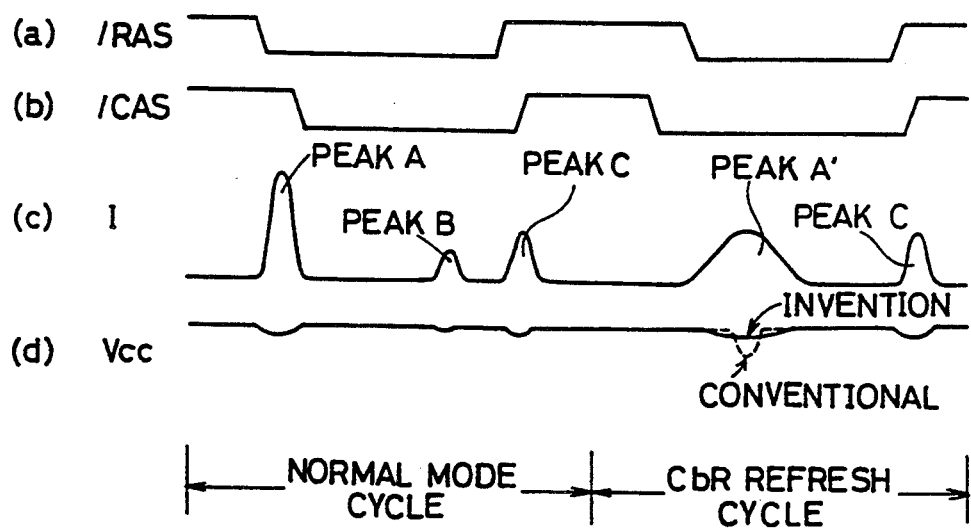
FIG. 13 shows the effect of the present invention.

FIG. 13 shows the distribution of peak current in a DRAM according to the present invention. It can be appreciated from FIG. 13 that the distribution of peak current and the level of the peak value are similar to those of a conventional case at the normal mode of operation where data input/output is carried out. In the on-board level, the actual number of operating DRAM chips is small. The effect of peak current I to the power line and ground line on the board is small. Therefore, erroneous operation of the system caused by noise on the power line and/or ground line is eliminated.

At the time of CbR refresh mode, the peak value of current flowing by charging/discharging of a bit line during sense amplifier operation is small. The peak value of peak current (peak A') is small even when many DRAM chips enter an operating state at the time of refresh mode operation, so that the amount of noise on the power line and/or the ground line is significantly small. Erroneous operation of the system does not occur (refer to the change in Vcc of the present invention indicated in a solid line and of a convention case indicated in a broken line).

Although a DRAM is described in the above embodiment, the present invention is applicable to a dynamic type semiconductor memory device where refresh operation of memory cell data is required.

The refresh mode is not limited to the CbR refresh mode described in the embodiment, and may be a refresh mode such as a self refresh mode, and automatic refresh mode where refresh instruction is supplied by an externally applied signal /REF.

According to the present invention, the driving capability of a sense amplifier is reduced at the time of refresh operation, so that the effect of noise to a power line and/or a ground line on a board can be reduced without penalty in access time, whereby erroneous operation of the system is prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic type semiconductor memory device including a plurality of dynamic type memory cells each having storage data restored in a refresh mode of operation, comprising:

sense amplifier means for sensing, amplifying and latching data of selected dynamic type memory cells; and control means, responsive to a refresh mode instructing signal instructing said refresh mode of operation, for slowing down a speed of the sensing and amplifying operation of said sense amplifier means to a speed slower than in a normal mode of operation in which external access is made to a selected dynamic memory cell among said selected memory cells, said refresh mode of operation and said normal mode of operation being independent of each other for said selected memory cells.

2. A dynamic type semiconductor memory device according to claim 1, wherein said sense amplifier means includes a charging sense amplifier for amplifying data of the selected memory cell to an operating power potential level when sensed data indicates a first level, and wherein said control means includes:

current supply means for supplying a current flow to said charging sense amplifier from an operating power source supplying the operating power potential, and adjusting means responsive to said refresh mode instructing signal for reducing an amount of the current flow flowing through said current supply means.

3. A dynamic type semiconductor memory device according to claim 2, wherein said current supply means includes a first current supply element, responsive to a sense activation signal activating the charging sense amplifier, for supplying a first current flow from the operating power source to the charging sense amplifier, and a second current supply element, provided in parallel with said first current supply element and responsive to said sense activation signal, for supplying a second current flow to said charging sense amplifier from said operating power source, and wherein said adjusting means comprises inhibition means, responsive to said refresh mode instructing signal, for inhibiting said second current supply element from supplying said second current flow.

4. A dynamic type semiconductor memory device including a plurality of dynamic type memory cells each having storage data restored in a refresh mode of operation, comprising:

sense amplifier means for sensing, amplifying and latching data of a selected dynamic type memory cell; and control means, responsive to a refresh mode instructing signal instructing said refresh mode of operation, for slowing down a speed of the sensing and amplifying operation of said sense amplifier means, wherein said sense amplifier means includes a charging sense amplifier for amplifying data of the selected memory cell to an operating power potential level when sensed data indicates a first level, said control means includes current supply means for supplying a current flow to said charging sense amplifier from an operating power source supplying the operating power potential; and adjusting means responsive to said refresh mode instructing signal for reducing an amount of the current flow flowing through said current supply means, said current supply means includes a first current supply element, responsive to a sense activation signal activating the charging sense amplifier, for supplying a first current flow from the operating power source to the charging sense amplifier; and a second current supply element, provided in parallel with said first current supply element and responsive to said sense activation signal, for supplying a second current flow to said charging sense amplifier from said operating power source, said adjusting means comprises inhibition means, responsive to said refresh mode instructing signal, for inhibiting said second current supply element from supplying said second current flow, said charging sense amplifier comprises a p channel insulated gate type transistor, said first and second current supply elements each comprise a p channel insulated gate type transistor, and said inhibition means includes a logic gate for performing logical sum operation on the sense activation signal and the refresh mode instructing signal.

5. A dynamic type semiconductor memory device according to claim 1, wherein said sense amplifier means includes a discharging sense amplifier for amplifying data of the selected memory cell to a ground potential level when sensed data indicates a first level, and wherein said control means includes current sink means for sinking a current flow from said discharging sense amplifier to a ground source providing the ground potential, and adjusting means, responsive to said refresh mode instructing signal, for reducing an amount of the current flow flowing through said current sink means.

6. A dynamic type semiconductor memory device according to claim 5, wherein said current sink means includes a first sink element, responsive to a sense activation signal for activating the discharging sense amplifier, for sinking a first current flow from said discharging sense amplifier to the ground source, and a second sink element, provided in parallel with said first sink element and responsive to said sense activation signal, for sinking a second current flow from said discharging sense amplifier to the ground source, and wherein said adjusting means includes inhibition means, responsive to said refresh mode instructing signal, for inhibiting the second sink element from sinking the second current flow.

7. A dynamic type semiconductor memory device including a plurality of dynamic type memory cells each having storage data restored in a refresh mode of operation, comprising:

sense amplifier means for sensing, amplifying and latching data of a selected dynamic type memory cell; and control means, responsive to a refresh mode instructing signal instructing said refresh mode of operation, for slowing down a speed of the sensing and amplifying operation of said sense amplifier means, wherein said sense amplifier means includes a discharging sense amplifier for amplifying data of the selected memory cell to a ground potential level when sensed data indicates a first level, said control means includes current sink means for sinking a current flow from said discharging sense amplifier to a ground source providing the potential; and adjusting means, responsive to said refresh mode instructing signal, for reducing an amount of the current flow flowing through said current sink means, said current sink means includes a first sink element, responsive to a sense activation signal for activating the discharging sense amplifier, for sinking a first current flow from said discharging sense amplifier to the ground source; and a second sink element, provided in parallel with said first sink element and responsive to said sense activation signal, for sinking a second current flow from said discharging sense amplifier to the ground source, said adjusting means includes inhibition means, responsive to said refresh mode instructing signal, for inhibiting the second sink element from sinking the second current flow, said first and second sink elements each comprise an n channel insulated gate type transistor, and said inhibition means includes a first logic gate for inverting the refresh mode instructing signal, and a second logic gate for performing a logical product operation on an output of the first logic gate and the sense activation signal.

8. A dynamic type semiconductor memory device, comprising:

a plurality of dynamic type memory cells arranged in rows and columns;

a plurality of pairs of bit lines, each pair having a column of the dynamic type memory cells coupled thereto;

a plurality of sense amplifiers each provided for one pair of the bit lines, for sensing and amplifying data read out on an associated pair of bit lines from a selected dynamic type memory cell;

current path means for providing a current path for conducting a current flow between a current source and each of said sense amplifiers, in response to a sense activation signal for activating the sense amplifiers; and control means, responsive to a refresh instructing signal for instructing refreshing of data of all the memory cells on a selected row among said rows, for reducing the amount of the current flow flowing through said current path means between said current source and said each of said sense amplifiers than that in a normal access mode of operation in which an external access is made to a selected memory cell.

9. A dynamic type semiconductor memory device according to claim 8, wherein said current path means includes a first transistor element responsive to said sense activating signal for coupling each said sense amplifier to a source supply, and a second transistor element, responsive to said sense activation signal and provided in parallel with the first transistor element, for coupling each of said sense amplifiers to said source supply, and said control means includes means, responsive to said refresh instructing signal, for bringing said second transistor element into a nonconductive state.

10. A dynamic type semiconductor memory device according to claim 9, wherein said source supply provides either an operating power supply potential or a ground potential.

11. A method of operating a dynamic type semiconductor memory device including a plurality of dynamic type memory cells each having storage data refreshed and a sense amplifier for sensing and amplifying data selected memory cells among said plurality of dynamic type memory cells, comprising the steps of:

activating the sense amplifier in response to a sense amplifier activating signal, and slowing down a speed of amplifying operation of the sense amplifiers in response to a refresh instructing signal instructing refreshing of the data of the selected memory cells to a speed slower than in a normal mode of operation in which an external access is made to a memory cell among said selected memory cells, said normal mode of operation being separate and independent mode of operation from the mode of refresh operation.

12. A method of according to claim 11, wherein said step of slowing down includes the step of reducing a current driving capability of a current flow path connecting the sense amplifier and a source supply, said current flow path causing a current flow to or from said sense amplifier from or to the source supply in response to said sense amplifier activating signal.

13. A dynamic type semiconductor memory device including a plurality of memory cells each having data restored in a refresh mode of operation and externally accessed in a normal mode of operation, comprising:

means responsive to an address signal for selecting memory cells among said plurality of memory cells;

sense amplifier means for sensing and amplifying data of a selected memory cells;

first control means responsive to a first control signal instructing said normal mode of operation for operating said sense amplifier means at a first rate of sensing and amplifying; and second control means responsive to a second control signal instructing said refresh mode of operation for operating said sense amplifier means at a second rate of sensing and amplifying, slower than said first rate, each of said normal mode of operation and said refresh mode of operation being independent of the other.

* * * * *